US010457012B2

(12) United States Patent
Jung et al.

(10) Patent No.: US 10,457,012 B2
(45) Date of Patent: Oct. 29, 2019

(54) METHOD FOR FABRICATING COLUMNAR OR LAMELLAR STRUCTURES OF ORGANIC MOLECULES ALIGNED INTO LARGE-AREA SINGLE DOMAIN

(71) Applicant: KOREA ADVANCED INSTITUTE OF SCIENCE AND TECHNOLOGY, Daejeon (KR)

(72) Inventors: Hee-Tae Jung, Daejeon (KR); Kiok Kwon, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 699 days.

(21) Appl. No.: 14/991,959

(22) Filed: Jan. 10, 2016

(65) Prior Publication Data

US 2016/0200068 A1    Jul. 14, 2016

(30) Foreign Application Priority Data

Jan. 14, 2015    (KR) .................. 10-2015-0006918

(51) Int. Cl.
*B32B 3/18* (2006.01)
*B32B 3/26* (2006.01)
(Continued)

(52) U.S. Cl.
CPC .............. *B32B 3/18* (2013.01); *B32B 3/26* (2013.01); *B32B 37/02* (2013.01); *B32B 37/06* (2013.01);
(Continued)

(58) Field of Classification Search
CPC ............. H01L 51/0035; H01L 51/0049; H01L 51/0076; H01L 51/0095; H01L 51/444;
(Continued)

(56) References Cited

U.S. PATENT DOCUMENTS

2013/0209757 A1*  8/2013  Willson .................. B29C 43/32
                                                                    428/195.1
2014/0238954 A1*  8/2014  Matsumiya .......... C09D 153/00
                                                                    216/67

FOREIGN PATENT DOCUMENTS

CN           101202213 A     6/2008
KR       10-0523765 B1     10/2005
(Continued)

OTHER PUBLICATIONS

Brian C. Berry, Aug. W. Bosse, Jack F. Douglas, Ronald L. Jones, Alamgir Karim, Orientational Order in Block Copolymer Films Zone Annealed below the Order-Disorder Transition Temperature, Nano Lett. 2007, 7, 9, 2789-2794 (Year: 2007).*

(Continued)

*Primary Examiner* — Mark W Tornow
(74) *Attorney, Agent, or Firm* — Hultquist, PLLC; Steven J. Hultquist

(57) ABSTRACT

The present invention relates to a method for fabricating columnar or lamellar structures of organic molecules aligned into a large-area single domain, and more particularly, to a method for fabricating columnar or lamellar structures of organic molecules aligned into a large-area single domain, in which organic molecules having a random alignment due to their poly-domain structure are spatially confined between a bottom substrate and a top substrate, and then heated above the isotropic transition temperature of the organic molecules, thereby allowing the organic molecules to have a new alignment different from the initial alignment. Columnar or lamellar structures of organic molecules aligned into a large-area single domain, which are fabricated by the fabrication of the present invention, are large-area single domains having a perfectly columnar shape. Also, because the organic molecules are spatially confined between flat substrates regardless of the properties of the substrates and are subjected to a heat-treatment process, the fabrication (Continued)

method according to the present invention enables nanostructures to be formed in a rapid and efficient manner compared to alignments methods employing high temperatures or solvents.

7 Claims, 8 Drawing Sheets

(51) Int. Cl.
*B32B 37/06* (2006.01)
*B32B 37/08* (2006.01)
*C23C 16/44* (2006.01)
*H01L 31/0224* (2006.01)
*H01L 31/18* (2006.01)
*H01L 33/42* (2010.01)
*H01L 51/00* (2006.01)
*H01L 51/44* (2006.01)
*H01L 51/52* (2006.01)
*B32B 37/02* (2006.01)
*B32B 37/14* (2006.01)
*B32B 38/10* (2006.01)
*H01L 51/42* (2006.01)
*B32B 37/24* (2006.01)

(52) U.S. Cl.
CPC ............ *B32B 37/08* (2013.01); *B32B 37/144* (2013.01); *B32B 38/10* (2013.01); *C23C 16/44* (2013.01); *H01L 31/022466* (2013.01); *H01L 31/1884* (2013.01); *H01L 33/42* (2013.01); *H01L 51/0035* (2013.01); *H01L 51/0049* (2013.01); *H01L 51/0076* (2013.01); *H01L 51/0095* (2013.01); *H01L 51/444* (2013.01); *H01L 51/5206* (2013.01); *H01L 51/5234* (2013.01); *B32B 2037/243* (2013.01); *B32B 2255/24* (2013.01); *B32B 2310/0831* (2013.01); *B32B 2457/00* (2013.01); *H01L 51/424* (2013.01); *H01L 2933/0016* (2013.01); *Y02E 10/549* (2013.01)

(58) Field of Classification Search
CPC ............ H01L 51/5206; H01L 51/5234; H01L 51/424
See application file for complete search history.

(56) References Cited

FOREIGN PATENT DOCUMENTS

| KR | 100778011 B1 | 11/2007 |
| KR | 101252506 B1 | 4/2013 |
| WO | 9830318 A2 | 7/1998 |
| WO | 0021689 A1 | 4/2000 |
| WO | 2004027078 A2 | 4/2004 |

OTHER PUBLICATIONS

Feng, X., et al., "Scalable Fabrication of Polymer Membranes With Vertically Aligned 1 nm Pores by Magnetic Field Directed Self-Assemby", "ACS NANO", 2014, pp. 11977-11986, vol. 8, No. 12.

* cited by examiner

METHOD FOR FABRICATING COLUMNAR OR LAMELLAR STRUCTURES OF ORGANIC MOLECULES ALIGNED INTO LARGE-AREA SINGLE DOMAIN

TECHNICAL FIELD

The present invention relates to a method for fabricating columnar or lamellar structures of organic molecules aligned into a large-area single domain, and more particularly, to a method for fabricating columnar or lamellar structures of organic molecules aligned into a large-area single domain, in which a thin film of organic molecules having a random alignment due to their poly-domain structure is spatially confined between a bottom substrate and a top substrate, and then heated at least the isotropic transition temperature of the organic molecules.

BACKGROUND ART

Formation of nanostructures by self-assembly of soft material molecules such as colloids, block copolymers, surfactants, supramolecules or the like has been studied for a long time. It is possible to form a variety of nanostructures based on the structures, shapes, interactions or the like of molecules themselves, and the use of nanostructures has an advantage in that it enables the development of effective nano-patterning technology. Studies on the formation of nanostructures using block copolymers among such soft material molecules have been actively conducted. However, in current technologies, a process of fabricating ordered structures over large areas is complex and requires a long time (a few hours), and thus there is a limitation in terms of commercial applications.

In the academic world, studies on the self-assembly properties of tapered organic supramolecules have been actively conducted in order to overcome the shortcoming of slow reorientation of block copolymers and to obtain stable structures having a smaller size (about 5 nm or less). On the other hand, self-assembly methods using liquid crystal molecules have the advantages of conventional patterning technology, including easy fabrication, ordered alignment over large areas, various sizes, etc., and also have a great advantage in that, because of the characteristic high mobility of liquid crystal molecules and the fast response of liquid crystal molecules to external fields, the processing speed of liquid crystal molecules is several tens of times higher than that of other self-assembled materials studied previously, and the structure can be easily controlled.

Supramolecular dendrimers having thermotropic liquid crystal properties are self-assembled to form cylindrical structures within a very short time, and nanostructures thereof have a feature size of several nm (<5 nm), which is very smaller than that of block copolymer nanostructures (several tens to several hundreds nm). Thus, it is expected that when supramolecular dendrimer nanostructures having such advantages are used as lithographic templates, they will overcome the limitations of block copolymers.

In particular, such cylindrical structures vertically aligned on substrates have received a great deal of attention, because these structures can be used as optoelectronic materials, selective membranes and nanopatterning templates. For this practical use, it is important to orderly align organic supramolecular cylindrical structures over large areas, but there has been difficulty in creating a vertical alignment of large-area single domains.

Korean Patent No. 1252506 discloses a polyacetylene supramolecular sieve having selectivity for lead ions. This Korean Patent discloses a method of detecting lead ions using the polyacetylene supramolecular sieve, but does not disclose a method for aligning supramolecules.

Korean Patent Registration No. 0778011 discloses a method of fabricating metal nanowires using self-assembled supramolecules. This Korean Patent discloses a method of fabricating metal nanowires using supramolecular hexagonal nanostructures, but has a shortcoming in that the use of non-metallic supramolecules is impossible, because columnar structures are formed using a combination of metal ions and supramolecules.

Accordingly, the present inventors have made extensive efforts to overcome the above-described problems, and as a result, have found that columnar or lamellar structures of organic molecules aligned into a large-area single domain are obtained by attaching organic molecules to a bottom substrate, and then covering the organic molecules with a top substrate to spatially confine the organic molecules between the bottom substrate and the top substrate, and heating the spatially confined organic molecules above the isotropic transition temperature of the organic molecules, thereby completing the present invention.

SUMMARY OF INVENTION

It is an object of the present invention to provide a method for fabricating columnar or lamellar structures of organic molecules aligned into a large-area single domain.

Another object of the present invention is to provide a lithographic template comprising the above columnar or lamellar structures of organic molecules, and a fabrication method thereof.

Still another object of the present invention is to provide an information storage device comprising large-area aligned nanostructures fabricated using the above lithographic template, and a fabrication method thereof.

Yet another object of the present invention is to provide a display device comprising large-area aligned nanostructures fabricated using the above lithographic template, and a fabrication method thereof.

A further object of the present invention is to provide a solar cell device comprising large-area aligned nanostructures fabricated using the above lithographic template, and a fabrication method thereof.

A still further object of the present invention is to provide an organic semiconductor device comprising large-area aligned nanostructures fabricated using the above lithographic template, and a fabrication method thereof.

A yet further object of the present invention is to provide a transparent electrode fabricated using the columnar or lamellar structures of organic molecules aligned into a large-area single domain, and a fabrication method thereof.

Another further object of the present invention is to provide a membrane fabricated using the columnar or lamellar structures of organic molecules aligned into a large-area single domain, which are fabricated by above method, and a fabrication method thereof.

To achieve the above objects, the present invention provides A method for fabricating columnar or lamellar structures of organic molecules aligned in a large-area single domain, the method comprising the steps of: (a) spatially confining organic molecules between a bottom substrate and a top substrate; and (b) heating the organic molecules confined spatially between the bottom substrate and the top substrate, at a temperature of at least the isotropic transition temperature of the organic molecules, and then cooling the organic molecules, thereby vertically aligning the organic molecules between the bottom substrate and the top substrate.

The present invention also provides a lithographic template comprising the columnar or lamellar structures of organic molecules aligned into a large-area single domain, which are fabricated by above method, and a fabrication method thereof.

The present invention also provides an information storage device comprising large-area aligned nanostructures fabricated using the above lithographic template, and a fabrication method thereof.

The present invention also provides a display device comprising large-area aligned nanostructures fabricated using the above lithographic template, and a fabrication method thereof.

The present invention also provides a solar cell device comprising large-area aligned nanostructures fabricated using the above lithographic template, and a fabrication method thereof.

The present invention also provides a solar cell device comprising large-area aligned nanostructures fabricated using the above lithographic template, and a fabrication method thereof.

The present invention also provides an organic semiconductor device comprising large-area aligned nanostructures fabricated using the above lithographic template, and a fabrication method thereof.

The present invention also provides a transparent electrode fabricated using the columnar or lamellar structures of organic molecules aligned into a large-area single domain, which are fabricated by above method, and a fabrication method thereof.

The present invention also provides a membrane fabricated using the columnar or lamellar structures of organic molecules aligned into a large-area single domain, which are fabricated by above method, and a fabrication method thereof.

BEST MODE FOR CARRYING OUT THE INVENTION

Figure 1:
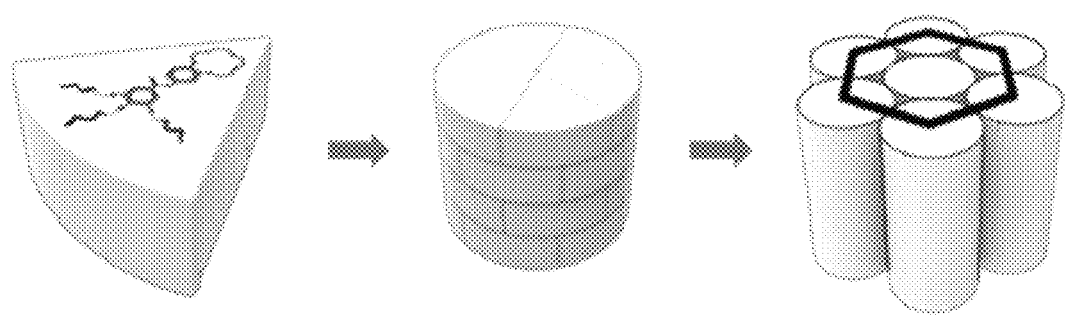
FIG. 1 is a schematic diagram showing a process in which organic molecules are self-assembled to form a hexagonal columnar structure.

Unless otherwise defined, all technical and scientific terms used herein have the same meaning as commonly understood by one of ordinary skill in the art to which the invention pertains. Generally, the nomenclature used herein are well known and commonly used in the art.

In the present invention, it was found that, when organic molecules spatially confined between a bottom substrate and a top substrate were heated above the isotropic transition temperature thereof, columns of the organic molecules aligned into a large-area single domain were formed.

In the present invention, organic molecules were dissolved in chloroform, and the solution was added dropwise to distilled water to form a thin film which was then transferred onto a bottom substrate. Next, the thin film was covered with a top substrate to spatially confine the organic molecules. Next, the spatially confined organic molecules were heated above the isotropic transition temperature thereof, and then cooled, and the top substrate was removed, thereby obtaining columnar structures aligned vertically with respect to the bottom substrate. As a result, it was found that the columnar structures were uniformly and vertically aligned over a large area.

Therefore, in one aspect, the present invention is directed to a method for fabricating columnar or lamellar structures of organic molecules aligned into a large-area single domain, the method comprising the steps of: (a) spatially confining organic molecules between a bottom substrate and a top substrate; and (b) heating the organic molecules, spatially confined between the bottom substrate and the top substrate, at a temperature above the isotropic transition temperature of the organic molecules, and then cooling the organic molecules, thereby vertically aligning the organic molecules between the bottom substrate and the top substrate.

As used herein, the term "single domain" means that block copolymers, graphene, supramolecules or crystalline materials, which have a single shape, are orderly aligned in a single direction, and also means that fundamental units having a circular columnar, hexagonal columnar, square columnar, pentagonal columnar or oval columnar shape are uniformly aligned in a certain direction. In addition, colloids having a spherical shape may be aligned in a certain direction among three-dimensional directions.

As used herein, the term "large-area single domain" means that this single domain has a size ranging from 0.1 mm×0.1 mm to 1 m×1 m. Thus, according to the present invention, it is possible to form a single domain over a large area, unlike conventional technologies in which a single domain having a size of 0.1 mm×0.1 mm or less is formed. Columnar or lamellar structures of organic molecules aligned into a large-area single domain, which are fabricated according to the method of the present invention, may preferably have a size of 0.1 mm×0.1 mm to 1 m×1 m, more preferably 1 mm×1 mm to 10 cm×10 cm.

As used herein, the term "isotropic transition temperature" means a temperature at which molecules become isotropic when these are heated. Generally, the terms refers to a temperature that is used to control liquid crystals. In particular, thermotropic liquid crystal materials are liquefied above the isotropic temperature thereof to form a liquid phase, and block copolymers are liquefied above the glass transition temperature thereof so that the amorphous segments thereof become flowable. This isotropic transition temperature differs between materials, and Table 1 below shows the isotropic transition temperatures of various materials.

TABLE 1

| Isotropic Transition Temperatures | |
|---|---|
| Formula 1 | 78° C. |
| Formula 2 | 111° C. |
| Formula 3 | 83.2° C. |
| Formula 4 | 203° C. |
| Formula 5 | 135° C. |
| Formula 6 | 66° C. |
| Formula 7 | 171° C. |
| Formula 8 | 64.9° C. |
| Formula 9 | 86° C. |
| Formula 10 | 107° C. |

In the present invention, step (b) may be a step of heating the organic molecules, spatially confined between the bottom substrate and the top substrate, above the isotropic transition temperature of the organic molecules, cooling the heated organic molecules, and then vertically aligning the organic molecules between the bottom substrate and the top substrate. Herein, the organic molecules are heated above the isotropic transition temperature thereof in order to orderly align the organic molecules, and the isotropic transition temperatures of various compounds represented by various formulas are as shown in Table 1 above. In addition, if the organic molecules are heated at a temperature excessively higher than the isotropic transition temperature thereof, the mobility of the organic molecules will increase, making it difficult to form a uniform film. For this reason, the organic molecules are preferably heated at a temperature that is about 1-2° C. higher than the isotropic transition temperature thereof, but is not limited thereto.

As used herein, the term "lamellar structure" generally means a bilayer structure formed of phospholipid, in which hydrophobic moieties form the core of the bilayer, and hydrophilic moieties form the shell, thereby forming a spherical molecular aggregate or a bilayer structure. This lamellar structure is most frequently observed in phospholipids, but liquid crystal molecules or block copolymers can also form bilayer lamellar structures.

In the present invention, step (a) may be one of the following steps (i) to (iii): step (i) in which a thin film of the organic molecules is formed on the bottom substrate, and then covered with the top substrate to spatially confine the organic molecules between the bottom substrate and the top substrate; step (ii) in which the organic molecules are allowed to form a thin film between the bottom substrate and the top substrate by a capillary phenomenon in a state in which the bottom substrate and the top substrate are spaced apart from each other, thereby spatially confining the organic molecules between the bottom substrate and the top substrate; or step (iii) in which a thin film of the organic molecules is formed on the bottom substrate, and then the top substrate is formed on the thin film by (1) polymer solution spin coating, (2) carbon sputtering, or (3) initiated chemical vapour deposition (iCVD), thereby spatially confining the organic molecules between the bottom substrate and the top substrate. The method of spatially confining the organic molecules between the bottom substrate and the top substrate may be performed by various methods, but is preferably one of the following methods (i) to (iii): method (i) in which a thin film of the organic molecules is formed on the bottom substrate, and then covered with the top substrate to spatially confine the organic molecules between the bottom substrate and the top substrate; method (ii) in which the organic molecules are allowed to form a thin film between the bottom substrate and the top substrate by a capillary phenomenon in a state in which the bottom substrate and the top substrate are spaced apart from each other, thereby spatially confining the organic molecules between the bottom substrate and the top substrate; and method (iii) in which a thin film of the organic molecules is formed on the bottom substrate, and then the top substrate is formed on the thin film by (1) polymer solution spin coating, (2) carbon sputtering, or (3) initiated chemical vapour deposition (iCVD), thereby spatially confining the organic molecules between the bottom substrate and the upper substrate. More preferably, the method may be used, in which a thin film of the organic molecules is formed on the bottom substrate, and then covered with the top substrate to spatially confine the organic molecules between the bottom substrate and the top substrate.

In the present invention, the organic molecules may have a structure represented by any one of the following formulas 1 to 10, but are not limited thereto:

Formula 1

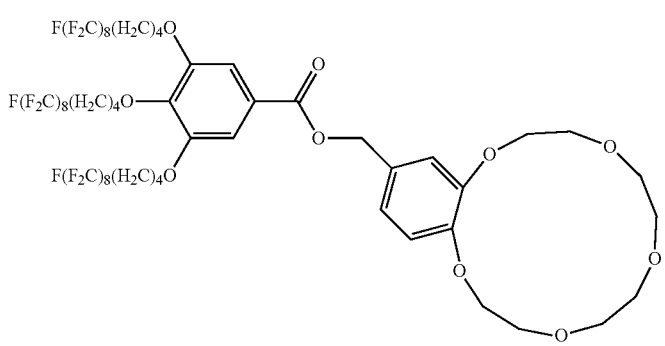

-continued
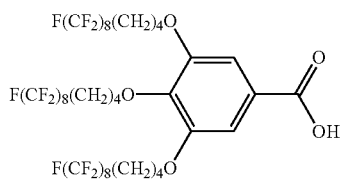
Formula 2
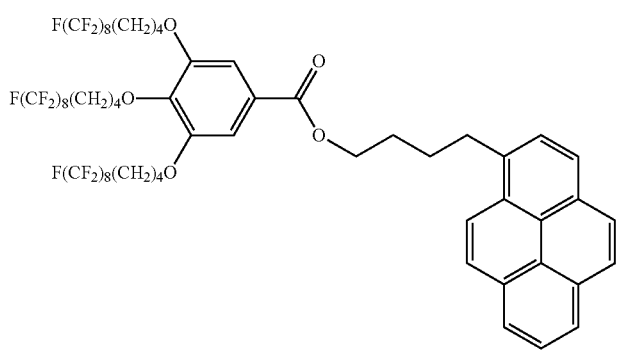
Formula 3
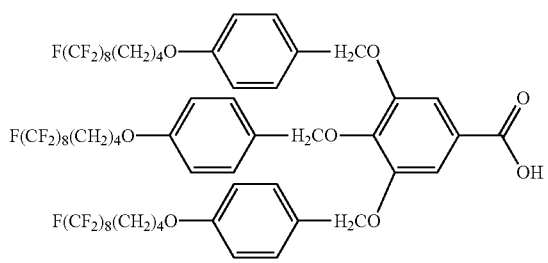
Formula 4
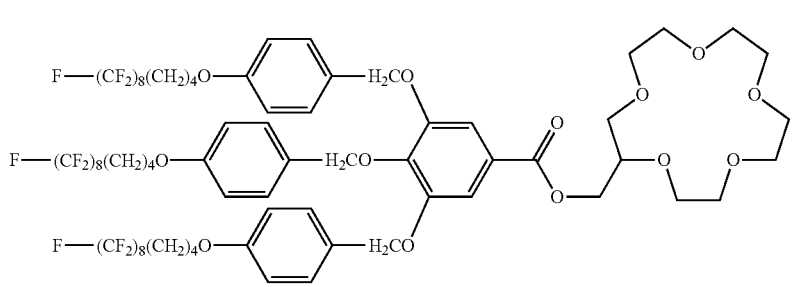
Formula 5
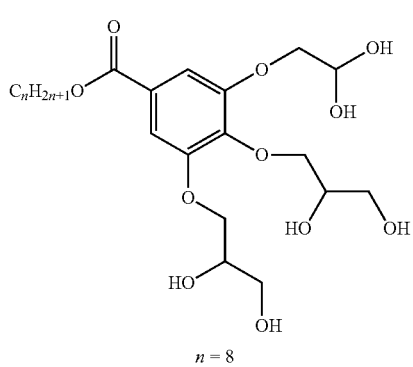
Formula 6
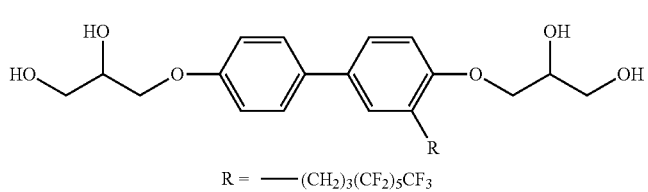
Formula 7

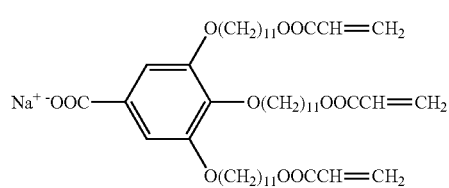

Formula 8

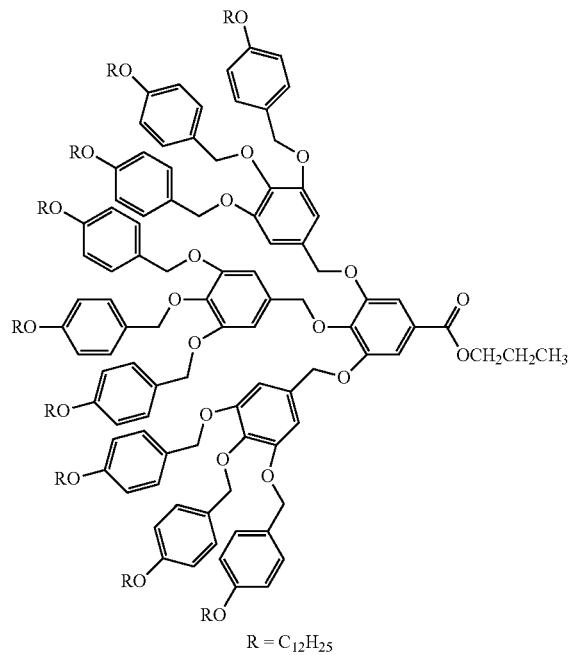

Formula 9

R = C₁₂H₂₅

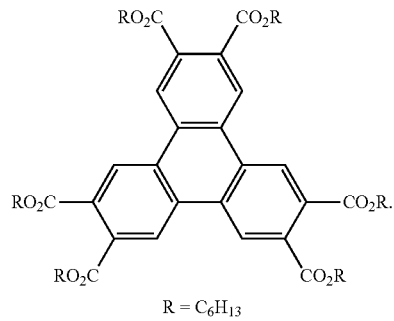

R = C₆H₁₃

Formula 10

The organic molecules that are used in the present invention are not novel. In the present invention, these organic molecules were synthesized according to conventional methods and used for large-area alignment. As shown in Formula 1 above, the organic molecule comprises three semi-fluorinated tails, two phenyl groups, and a central crown ether group, and has a tapered monodendron formed by micro-phase separation in the molecule. It was reported that such tapered monodendrons are self-assembled to form columns, and finally, such columns are gathered to form stable columnar structures (FIG. 1). However, such columnar structures are very stably formed, but are not aligned in the same direction over a large area, and form a polydomain.

In the present invention, step (a) may be a step in which a thin film of the organic molecules is formed on the bottom substrate and covered with the top substrate. Herein, the thin film can be formed by a casting, spin coating, inkjet printing or deposition method, but may preferably be formed by a method comprising: dissolving the organic molecules in an organic solvent, adding the solution dropwise to distilled water to form a thin film, and transferring the thin film onto the bottom substrate.

In the present invention, the method for fabricating the columnar or laminar structures may further comprise, after step (b), step (c) of removing the top substrate, thereby obtaining the organic molecules aligned vertically with respect to the bottom substrate. The top substrate is used to spatially confine the organic molecules, and is preferably a substrate that can be removed after vertical alignment of the organic molecules so that the vertically aligned organic molecules can be used.

In the present invention, the bottom substrate may be a silicon wafer, a glass substrate, an ITO substrate, a polymer film substrate, or a substrate having a uniform surface coated with a polymer or carbon. The bottom substrate that is used in the present invention may be a silicon wafer substrate, a glass substrate, a polymer film substrate or the like, but is preferably a substrate coated with a polymer or carbon in order to impart various surface properties to the bottom substrate. More preferably, the bottom substrate may be a substrate obtained by coating fluorinated resin and polyethylenimine on a carbon surface. In particular, the surface of the bottom substrate should be very uniform, and the bottom substrate is preferably a substrate that maintains good contact with the organic molecules in order to the organic molecules having mobility from being dewet from the substrate when the organic molecules are heated above the isotropic transition temperature thereof. The polymer film that may be used in the present invention may be made of triacetylcellulose, acryl, polyurethane or polyimide, but is not limited thereto. The polymer that is used to coat the substrate may be polyethyleneimide, Teflon resin, polymethylmethacrylate, or polyvinyl acetate, but is not limited thereto.

In the present invention, the top substrate may be made of polyurethane, polybutadiene, polyneoprene, polydimethylsiloxane, or perfluoropolyether. The top substrate that is used in the present invention may be made of any material that has a uniform surface and that can maintain conformal contact with the organic molecule thin film regardless of the surface properties thereof. Preferably, the top substrate may be made of polyurethane, polybutadiene, polyneoprene, polydimethylsiloxane, or perfluoropolyether. More preferably, the top substrate may be made of polydimethylsiloxane. Even more preferably, the top substrate may be one of the following substrates (i) to (iv): (i) a substrate obtained by coating a washed silicon wafer with a mixture of a silicone elastomer base and a curing agent, followed by thermal curing; (ii) a substrate by coating fluorinated resin and polyethyleneimine on a surface pretreated with a UV-ozone lamp; (iii) a substrate obtained by coating amorphous carbon on a surface by sputtering; and (iv) a substrate obtained by coating a mixture of perfluoropolyether-urethane dimethacrylate and a photoinitiator on a silicon wafer and curing the coating with UV light under an argon atmosphere.

In the present invention, a combination of the top substrate and the bottom substrate may be any combination of materials that are uniformly smooth regardless of the surface properties and that prevent the organic molecules from being dewet from the top and bottom substrates in a heat-treatment process. Preferably, any one of the combinations shown in Table 2 may be used. More preferably, polydimethylsiloxane as the top substrate and a carbon film as the bottom substrate may be used, as long as the organic molecules can be stably confined between the upper and bottom substrates in a heat-treatment process.

TABLE 2

Combinations of Top Substrate and Bottom Substrate

|  | Top substrate | Bottom substrate |
|---|---|---|
| ① | Polydimethylsiloxane | Carbon |
| ② | Polydimethylsiloxane | Teflon |
| ③ | Polydimethylsiloxane coated with carbon | Carbon |
| ④ | Polydimethylsiloxane coated with carbon | Carbon film coated with Teflon |
| ⑤ | Polydimethylsiloxane coated with Teflon | Carbon |
| ⑥ | Polydimethylsiloxane coated with Teflon | Carbon film coated with polyethyleneimine |
| ⑦ | Polydimethylsiloxane coated with polyethyleneimine | Carbon film coated with polyethyleneimine |
| ⑧ | Polydimethylsiloxane coated with polyethyleneimine | Carbon film coated with Teflon |
| ⑨ | Polydimethylsiloxane coated with polyethyleneimine | Carbon film coated with polymethylmethacrylate |
| ⑩ | Polydimethylsiloxane | Carbon film coated with polymethylmethacrylate |
| ⑪ | Perfluoropolyether | Carbon |
| ⑫ | Perfluoropolyether | Carbon film coated with Teflon |
| ⑬ | Perfluoropolyether | Carbon film coated with polyethyleneimine |
| ⑭ | Perfluoropolyether | Carbon film coated with polymethylmethacrylate |

In the present invention, the spacing between the bottom substrate and the top substrate may be 1 nm to 100 μm, preferably 10 nm to 1000 nm. The organic molecules spatially confined between the bottom substrate and the top substrate is vertically aligned by heat treatment. If the spacing between the bottom substrate and the top substrate is less than 1 nm, the organic molecules will not be vertically aligned, because the space therebetween is insufficient, and if the spacing between the bottom substrate and the top substrate is more than 100 μm, the organic molecules will be aligned into a poly-domain, but not a single domain or a lamellar structure.

In addition, the present invention is directed to a lithographic template using the columnar or lamellar structures of organic molecules aligned into a large-area single domain, which are fabricated by above method, and a fabrication method thereof.

The present invention is also directed to an electronic device comprising large-area aligned nanostructures which are fabricated using the above-described lithographic template, and to a fabrication method thereof.

In the present invention, the electronic device may be fabricated by a method comprising the steps of:

(i) (1) irradiating the lithographic template with UV light to selectively remove a portion of organic molecules to thereby form patterns, and then transferring the patterns to a silicon wafer by reactive ion etching to thereby form nanostructures; or (2) selectively bonding metallic or inorganic precursors to a portion of organic molecules, and subjecting the organic molecules to an oxidation, reduction or organic molecule removal process, thereby forming metallic or inorganic nanostructures; and (ii) forming an electronic device using the nanostructures.

In the present invention, the electronic device may be any one of display devices and solar cell devices.

The present invention is also directed to a membrane fabricated using columnar or lamellar structures of organic molecules aligned into a large-area single domain, which are fabricated by the above-described method, and to a fabrication method thereof. The cores of the columnar or lamellar structures of organic molecules aligned into a large-area single domain have pores having a size of 1 nm or less. Herein, when the cores of the columnar or lamellar structures of organic molecules are modified to impart functionality to the structures, the columnar or lamellar structures may be used as various membranes.

In the present invention, the membrane may be characterized in that the cores of the columnar or lamellar structures of organic molecules aligned into a large-area single domain can be bonded with ions or heavy metals or are ionically conductive. If the core can be bonded with ions, it can be used as a membrane for removing certain ions (desalting process), and if the core can be bonded with heavy metals, it can be used as a membrane for removing heavy metals. In addition, if the core is ionically conductive, it can be used as an ion channel.

The present invention is also directed to a transparent electrode using the columnar or lamellar structures of organic molecules aligned into a large-area single domain, which are fabricated by the above-described method, and to a fabrication method thereof.

In the present invention, the method for fabricating a transparent electrode may comprise the steps of:

(i) attaching a metal salt to the core of columnar or lamellar structures of organic molecules aligned into a large-area single domain;

(ii) oxidizing the columnar or lamellar structure to obtain ordered metal oxide, and growing ordered carbon nanotubes using the ordered metal oxide; and (iii) forming a transparent electrode using the ordered carbon nanotubes.

EXAMPLES

Hereinafter, the present invention will be described in further detail with reference to examples. It will be obvious to a person having ordinary skill in the art that these examples are illustrative purposes only and are not to be construed to limit the scope of the present invention. Thus, the substantial scope of the present invention will be defined by the appended claims and equivalents thereof.

Figure 4:
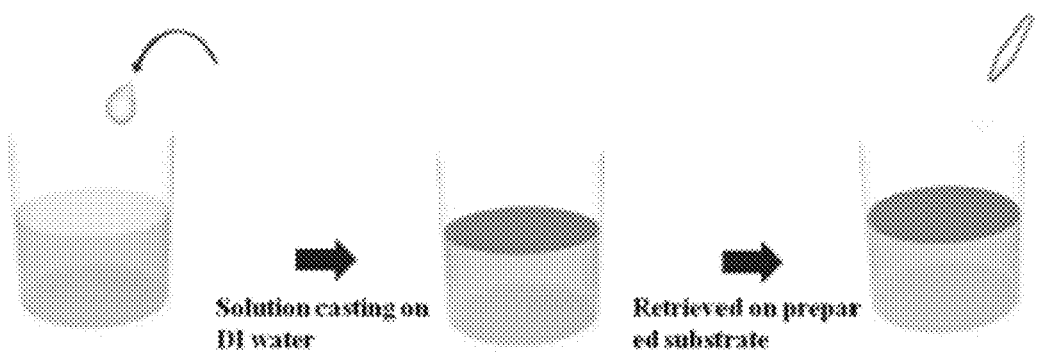
FIG. 4 shows a process in which a thin film is formed by adding a solution of organic molecules dropwise to distilled water.

Example 1: Preparation of Organic Supramolecular Thin Film, Bottom Substrate and Top Substrate As shown in FIG. 4, organic molecules having a structure represented by Formula 1 were dissolved in chloroform, and then added dropwise to distilled water at room temperature to form a thin film. The formed thin film (100-200 nm) was transferred onto a bottom substrate to be used, and the remaining water was removed by evaporation on a hot plate at 50° C.

In order to impart various properties to a bottom substrate, fluorinated resin (0.1 wt % Teflon AF, Dupont, solvent Fluorinert FC-77, 3M) and polyethyleneimine (1 wt % PEI, Aldrich, solvent DI water) were spin-coated on a carbon surface on a transmission electron microscope grid (TEM grid) to thereby prepare a bottom substrate.

A top substrate was prepared by mixing a silicone elastomer base (Sylgard 184, Dow Corning) and a silicone elastomer curing agent (Sylgard 184, Dow Corning) at a weight ratio of 10:1, and placing the mixture on the surface of a washed silicon wafer, followed by curing at 80° C. for 2 hours. In order to impart various surface properties to the top substrate, fluorinated resin (0.1 wt % Teflon AF, Dupont, solvent Fluorinert FC-77, 3M) and polyethyleneimine (1 wt % PEI, Aldrich, solvent DI water) were spin-coated on the surface cured with a UV-ozone lamp.

Figure 2:
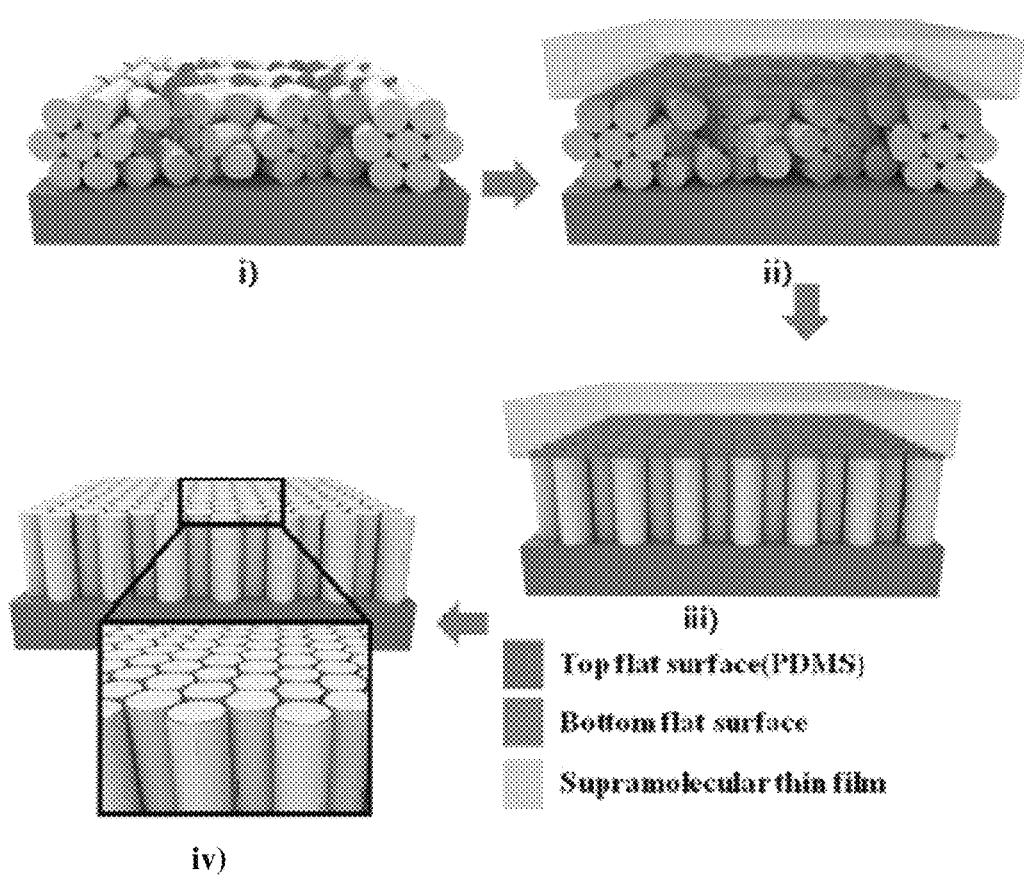
FIG. 2 is a schematic diagram showing a method for fabricating columns of organic molecules aligned into a large-single domain.

Example 2: Preparation of Large-Area Single Domain of Supramolecular Hexagonal Columns As shown in FIG. 2, the organic molecular thin film of Example was transferred onto the bottom substrate of Example 1, and then covered with the top substrate. In this step, as shown in FIG. 2 (ii), the organic molecules had a plurality of domains and a random orientation. Next, the organic molecules spatially confined between the bottom substrate and the top substrate were heated above the isotropic transition temperature thereof, and then cooled to room temperature at a rate of −0.1° C./min. Herein, the cooling rate did not influence the alignment of the organic molecular columns. In fact, in the cooling rate ranging from −0.1 to −30° C./min, the same structures are formed. In addition, the heating and cooling processes were performed such that the organic molecules would necessarily be confined between the bottom substrate and the top substrate.

Figure 3:
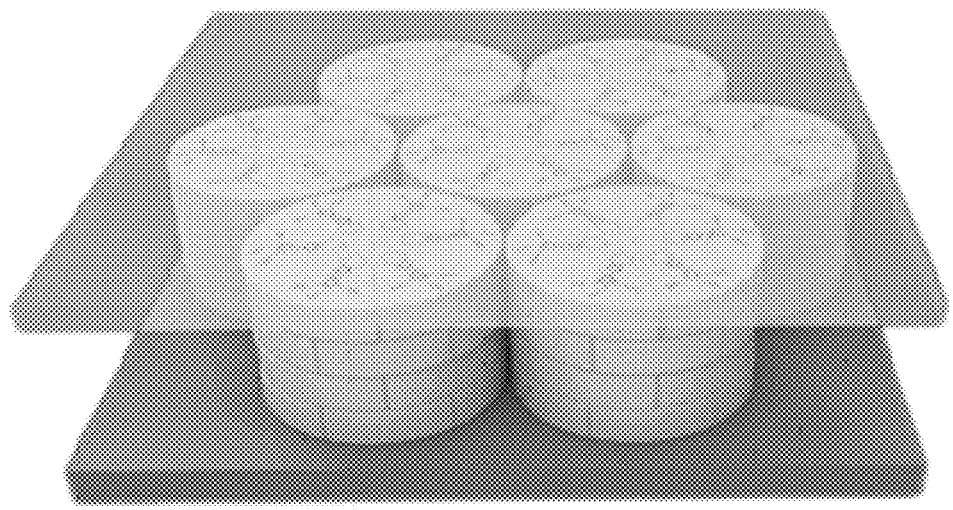
FIG. 3 shows organic molecules aligned vertically between a bottom substrate and a top substrate.

Through the heating and cooling processes, the organic molecules had an arrangement completely different from the initial arrangement. As shown in FIG. 3, between the two flat substrates (bottom and top substrates), columns of the organic molecules had a homeotropic alignment in which they were aligned vertically with respect to the two substrates. Next, the organic molecules were cooled, and the top substrate was removed from the organic molecules, thereby obtaining a large-area columnar structure aligned vertically with the bottom substrate.

Experimental Example 1: Analysis of Columnar Structures of Organic Molecules

The vertically aligned, large-area columnar structure can be analyzed by TEM. For TEM analysis, a carbon supported TEM grid (CF200-Cu) was used as the bottom substrate, and the same process as described above was performed, thereby preparing vertically aligned columns. The top substrate was removed, after which the columns were exposed to and stained with $RuO_4$ (5 wt % solution in water) vapor for 3 minutes, and then analyzed by a transmission electron microscope (TEM). The organic molecular film formed by solution casting had a thickness of 100-150 nm. For smooth TEM analysis, a film thickness of 100 nm is suitable, but the thickness of organic molecular films in the preparation of vertically aligned, large-area columns is not greatly limited.

Figure 5:
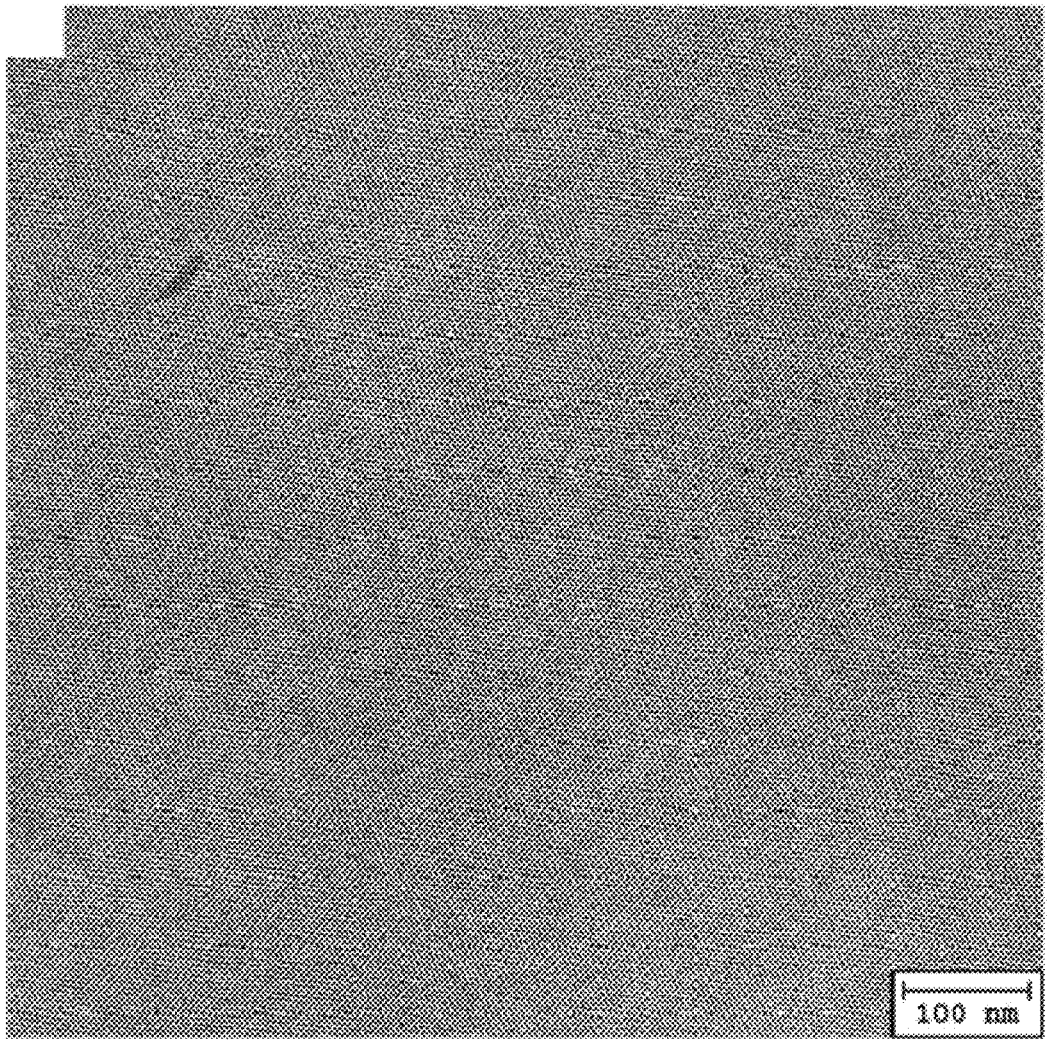
FIG. 5 is a TEM image of vertically aligned single-domain columns of organic molecules (bottom substrate: CF200-Cu; top surface: PDMS; supramolecular thickness: 100 nm; cooling condition: −0.1° C./min to RT from 81° C.)
Figure 6:
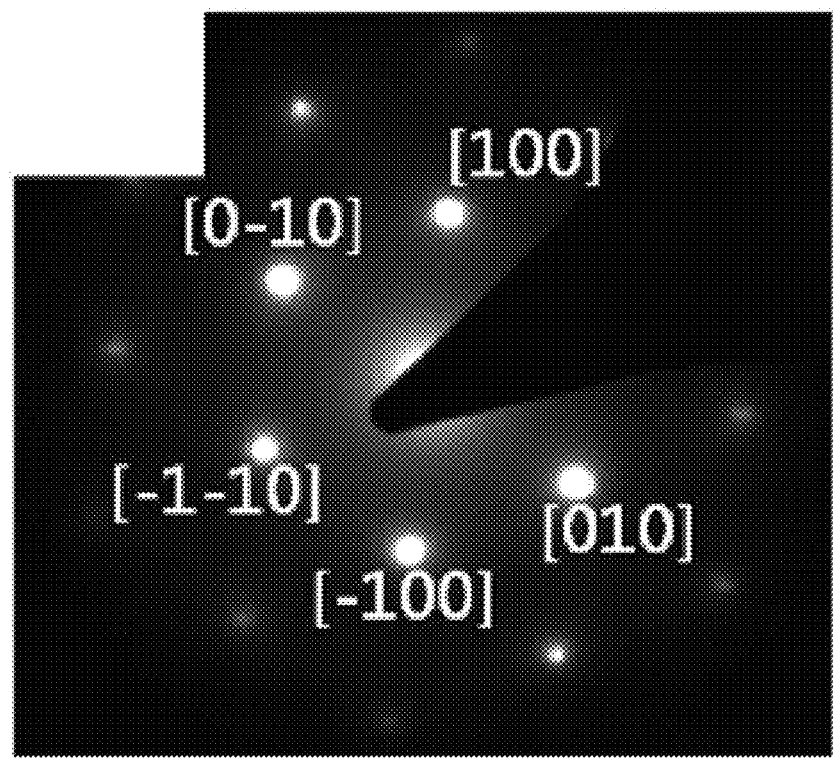
FIG. 6 is an SAED (selected area electron diffraction) image of vertically aligned single-domain columns of organic molecules.
Figure 7:
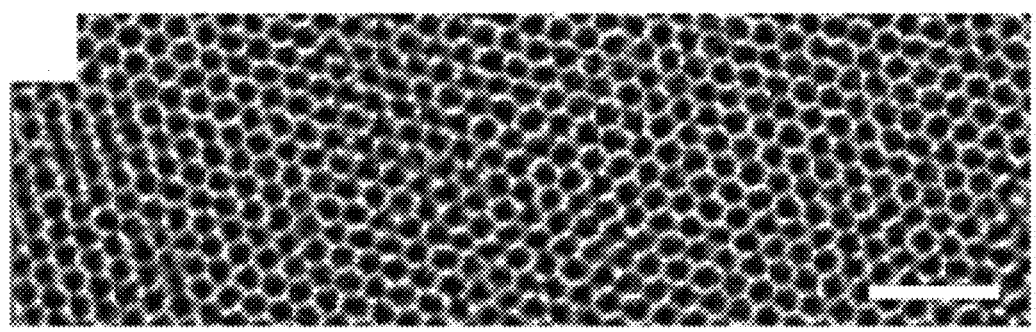
FIG. 7 is a high-magnification TEM image of a vertically aligned single-domain column of organic molecules.

As shown in FIG. 5, perfect hexagonal columnar structures of vertically aligned organic molecules were observed by TEM analysis (bottom substrate: CF200-Cu; top surface: PDMS; organic molecular film thickness: 100 nm; cooling condition −0.1° C./min to RT from 81° C.). As shown in FIG. 6, organic molecular columns were completely hexagonally packed. The high-magnification TEM image in FIG. 7 more clearly shows a hexagonal columnar array of organic molecules. The black portions in the TEM image are the $RuO_4$-stained portions of the phenyl group and crown ether portion of the core of organic molecules, and correspond to the core of organic molecular columns. The results of TEM image analysis indicated that the formed organic molecular columns had a diameter of 4.57 nm and a core size of 3.42 nm.

Figure 8:
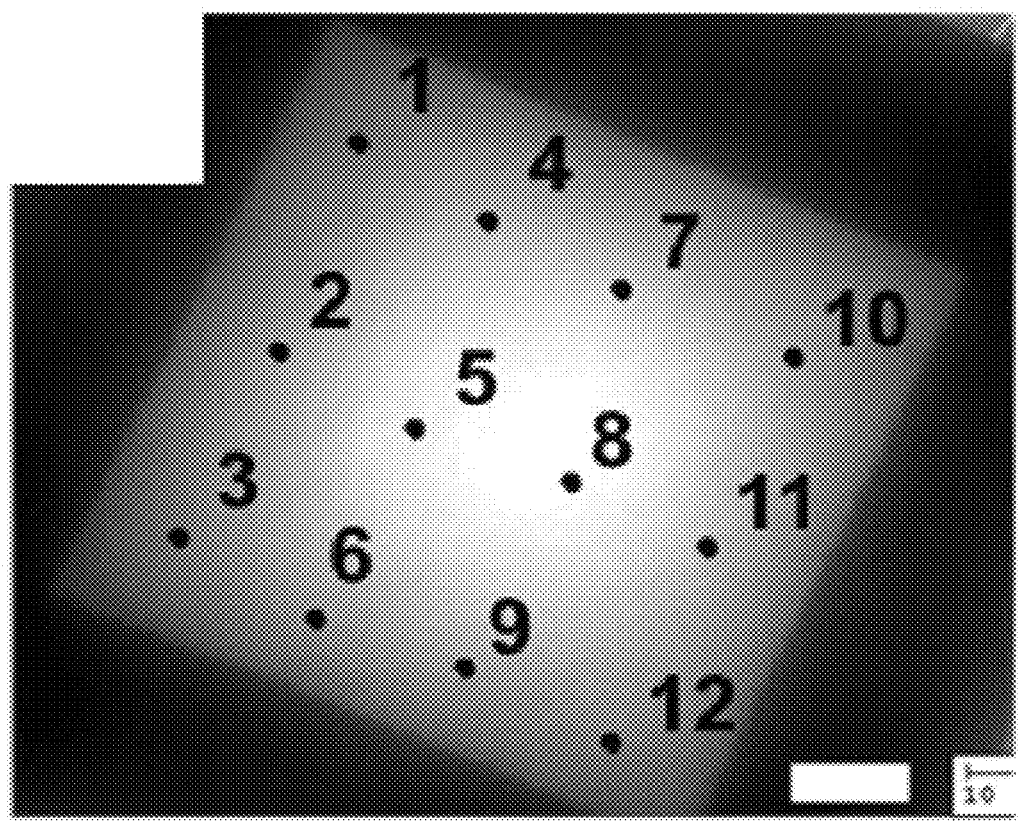
FIG. 8 shows a low-magnification TEM grid image (scale bar: 20 μm) and observation positions.
Figure 9:
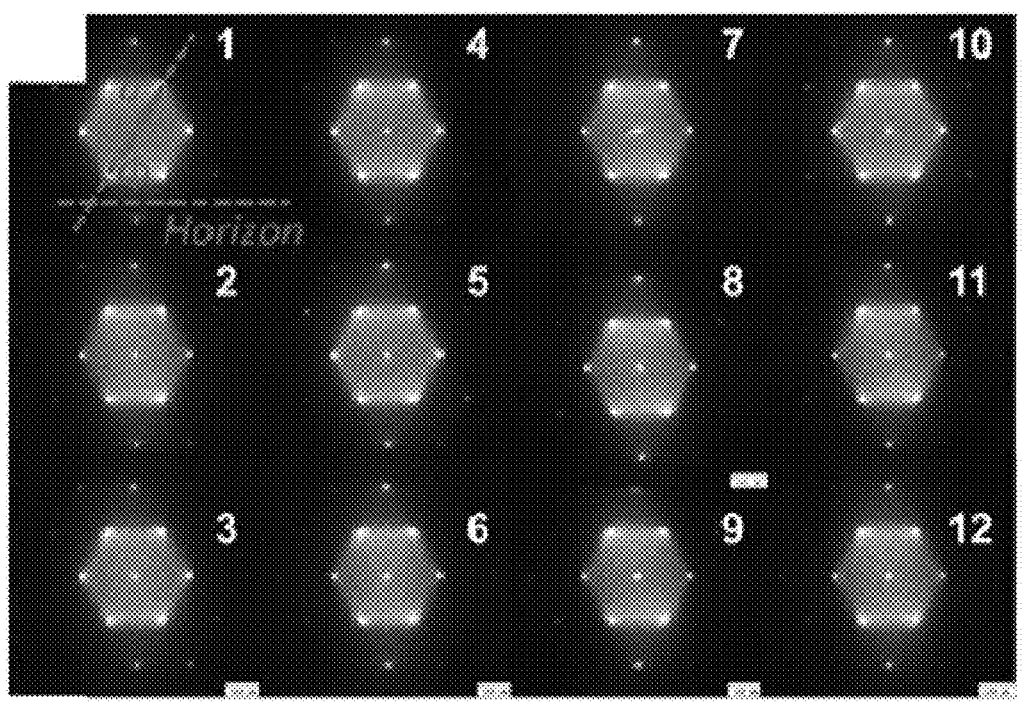
FIG. 9 shows FFT (fast Fourier transform) patterns (~100×100 μm$^2$) at 12 positions.
Figure 10:
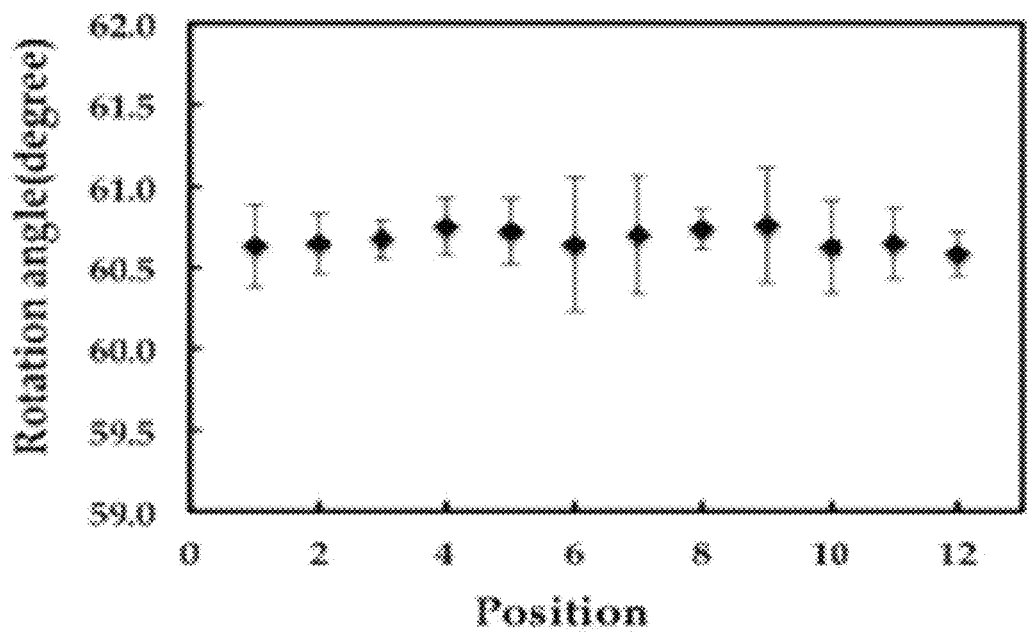
FIG. 10 shows difference in rotation angles between 12 positions.
Figure 11:
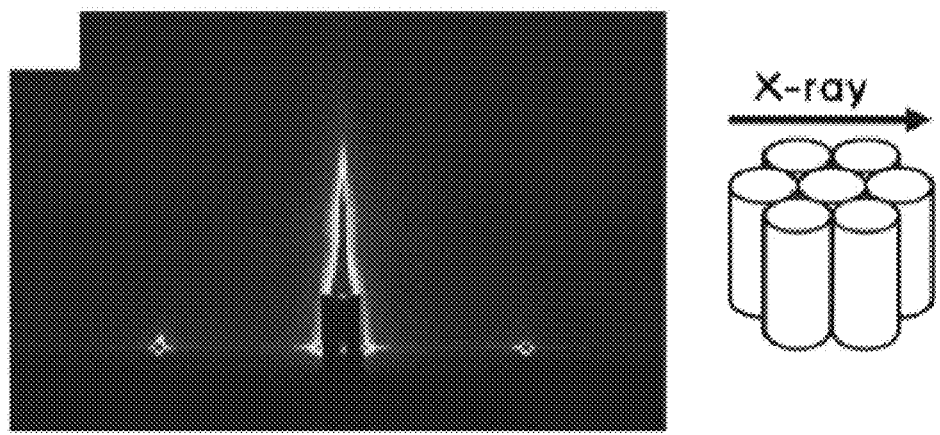
FIG. 11 shows the results of GISAXS (grazing-incidence small-angle scattering) analysis of vertically aligned single-domain columns of organic molecules formed on a substrate.

Experimental Example 2: Observation of Formation of Single Domain of Organic Molecular Columns FIG. 5 shows only structures in a small area in order to show a clear image. However, in fact, the structures were formed as a single domain over a large area. FIG. 8 shows a cell of a TEM grid, which has a size of 100 μm×100 μm. The entire area of the TEM grid cell corresponds to a single domain, and to demonstrate this fact, TEM images of 12 different points (1 to 12) were acquired, and FFT patterns of the 12 points were examined. As a result, the 12 points showed the same pattern (FIG. 9). In addition, as shown in FIG. 9, the angle between the horizontal line and the a-line was defined as rotation angle (Φ), and the rotation angles of points 1 to 12 were examined. As a result, as shown in FIG. 10, the difference in the rotation angle between the positions was smaller than the angle measurement error, suggesting that a single domain was formed over the entire area of FIG. 5. In addition, columnar structures of vertically aligned organic molecules formed on a carbon-coated silicon wafer substrate were analyzed by GISAXS (grazing-incidence small-angle scattering). As a result, as shown in FIG. 11, the organic molecular columns were vertically aligned with the bottom substrate over a large area.

As described above, columnar or lamellar structures of organic molecules aligned into a large-area single domain, which are fabricated by the fabrication method according to the present invention, are large-area single domains having a perfect columnar shape. Thus, these columnar or lamellar structures are useful for the fabrication of display devices, solar cell devices, membranes, organic semiconductor devices, lithographic templates, or transparent electrodes.

Although the present invention has been described in detail with reference to the specific features, it will be apparent to those skilled in the art that this description is only for a preferred embodiment and does not limit the scope of the present invention. Thus, the substantial scope of the present invention will be defined by the appended claims and equivalents thereof.

What is claimed is:

1. A method for fabricating columnar or lamellar structures of organic molecules aligned in a large-area single domain, the method comprising the steps of:
   (a) spatially confining organic molecules between a bottom substrate and a top substrate; and
   (b) heating the organic molecules confined spatially between the bottom substrate and the top substrate, at a temperature of at least the isotropic transition temperature of the organic molecules, and then cooling the organic molecules, thereby vertically aligning the organic molecules between the bottom substrate and the top substrate,
   wherein the large-area single domain has a size ranging from 0.1 mm×0.1 mm to 1 m×1 m and
   the organic molecules are supramolecular dendrimer having self-assembly property.

2. The method of claim 1, wherein the step (a) is one of following steps (i) to (iii) of:
   (i) forming a thin film of the organic molecules on the bottom substrate, and then covering it with the top substrate thereby spatially confining the organic molecules between the bottom substrate and the top substrate;
   (ii) forming a thin film of the organic molecules between the bottom substrate and the top substrate by a capillary phenomenon in a state in which the bottom substrate and the top substrate are spaced apart from each other, thereby spatially confining the organic molecules between the bottom substrate and the top substrate; or
   (iii) forming a thin film of the organic molecules on the bottom substrate, and then forming the top substrate on the thin film by polymer solution spin coating, carbon sputtering, or initiated chemical vapor deposition (iCVD), thereby spatially confining the organic molecules between the bottom substrate and the top substrate.

3. The method of claim 1, wherein the organic molecules are selected from following formulas 1 to 10:

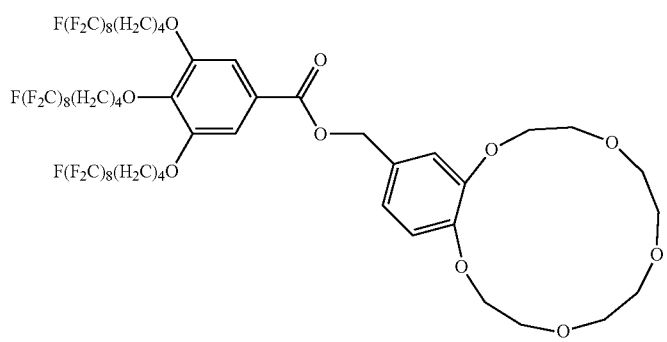

Formula 1

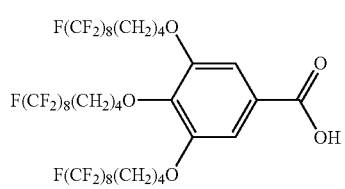

Formula 2

-continued
Formula 3
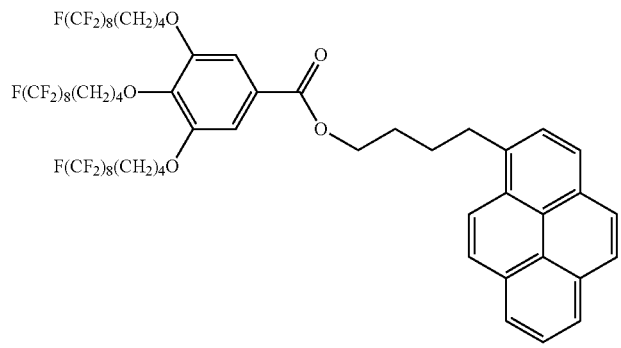
Formula 4
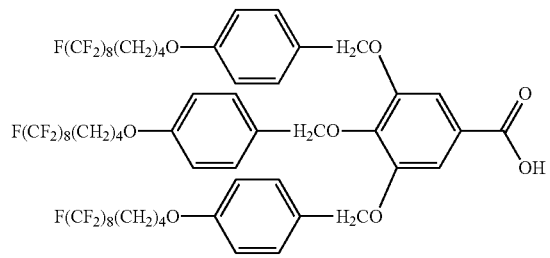
Formula 5
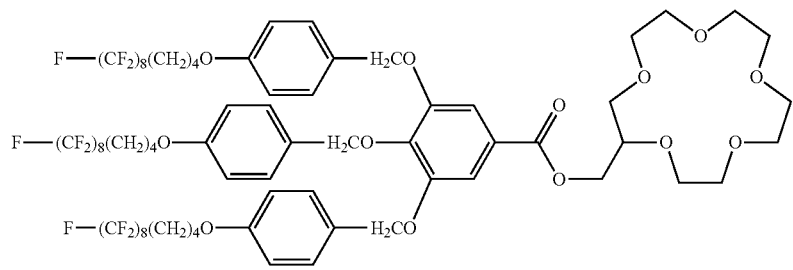
Formula 6
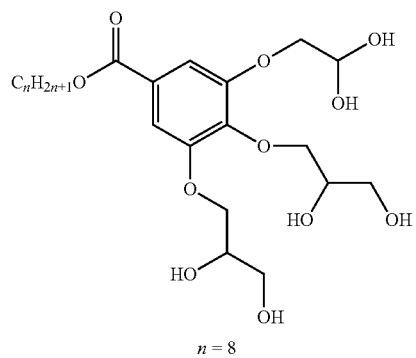
$n = 8$
Formula 7
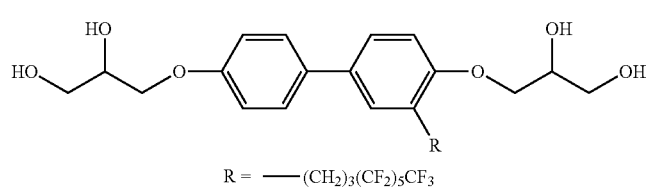
$R = \text{---}(CH_2)_3(CF_2)_5CF_3$
Formula 8
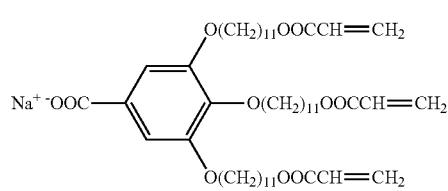

-continued

Formula 9

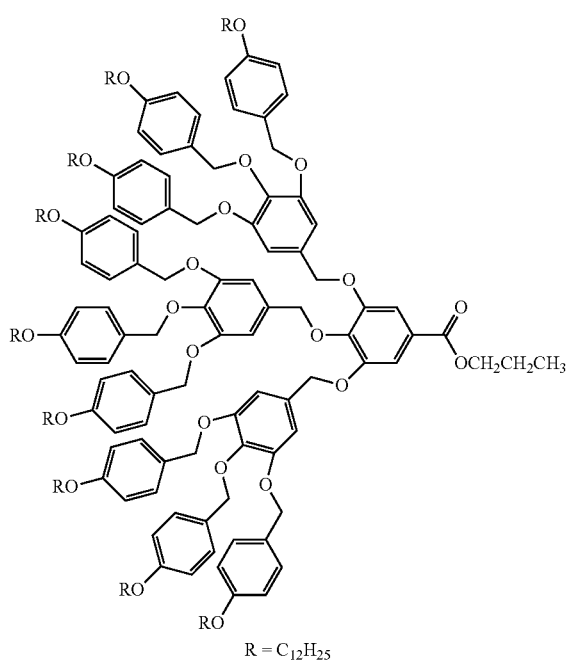

R = C$_{12}$H$_{25}$

Formula 10

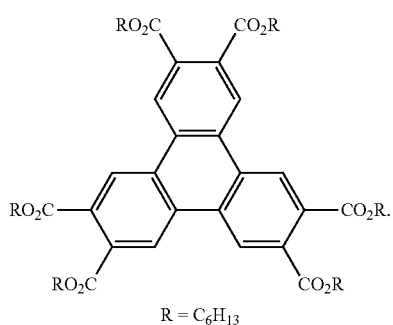

R = C$_6$H$_{13}$

4. The method of claim 1, further comprising a step (c) of removing the top substrate, thereby obtaining the organic molecules aligned vertically with respect to the bottom substrate.

5. The method of claim 1, wherein the bottom substrate is a silicon wafer, a glass substrate, an ITO substrate, a polymer film substrate, or a substrate coated with a polymer or carbon.

6. The method of claim 1, wherein a space between the bottom substrate and the top substrate is 1 nm to 100 μm.

7. The method of claim 1, wherein the large-area single domain has a size ranging from 1 mm×1 mm to 10 cm×10 cm.

* * * * *